(12) United States Patent
Ringermacher et al.

(10) Patent No.: US 7,078,702 B2
(45) Date of Patent: Jul. 18, 2006

(54) IMAGER

(75) Inventors: Harry Israel Ringermacher, Delanson, NY (US); Clifford Bueno, Clifton Park, NY (US); Armin Horst Pfoh, Niskayuna, NY (US); Jiunn-Ru Jeffrey Huang, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 337 days.

(21) Appl. No.: 10/064,549

(22) Filed: Jul. 25, 2002

(65) Prior Publication Data

US 2004/0016886 A1    Jan. 29, 2004

(51) Int. Cl.
*G01T 1/24* (2006.01)
*G01Y 1/161* (2006.01)

(52) U.S. Cl. .............................. 250/370.11; 250/363.02

(58) Field of Classification Search ........... 250/370.08, 250/370.09, 370.11, 370.14, 370.15; 378/4, 378/57, 59, 184; 257/E23.065, E23.127; 385/370.11, 363.02
See application file for complete search history.

(56) References Cited

U.S. PATENT DOCUMENTS

| | | | |
|---|---|---|---|
| 3,775,612 A * | 11/1973 | Foster et al. ................... 378/60 |
| 4,045,675 A | 8/1977 | Kingsley et al. |
| 4,180,737 A | 12/1979 | Kingsley |
| 5,519,751 A * | 5/1996 | Yamamoto et al. ......... 378/98.8 |
| 5,574,291 A | 11/1996 | Dodabalapur et al. |
| 5,587,591 A * | 12/1996 | Kingsley et al. ............... 257/59 |
| 5,596,208 A | 1/1997 | Dodabalapur et al. |
| 5,757,878 A * | 5/1998 | Dobbs et al. ................... 378/19 |
| 6,031,234 A * | 2/2000 | Albagli et al. .......... 250/370.11 |
| 6,107,117 A | 8/2000 | Bao et al. |
| 6,150,191 A | 11/2000 | Bao |
| 6,265,243 B1 | 7/2001 | Katz et al. |
| 6,278,127 B1 | 8/2001 | Dodabalapur et al. |
| 6,300,988 B1 | 10/2001 | Ishihara et al. |
| 6,335,539 B1 | 1/2002 | Dimitrakopoulos et al. |
| 6,563,120 B1 | 5/2003 | Baldwin et al. ............. 250/367 |
| 6,614,872 B1 * | 9/2003 | Bueno et al. ................... 378/58 |

(Continued)

OTHER PUBLICATIONS

J. Huang, W. Qian, H Klauk, T. N. Jackson, K. Black, P Deines-Iones, S. D. Hunter, "Active-Matrix Pixelized Well Detectors on Polymeric Substrates", IEEE 51th Nat. Aerospace & Electronics Conf., Oct. (2000), pp. 476-482.*

(Continued)

*Primary Examiner*—Albert J. Gagliardi
*Assistant Examiner*—James P. Hughes
(74) *Attorney, Agent, or Firm*—Penny A. Clarke; Patrick K. Patnode

(57) ABSTRACT

A flexible imager, for imaging a subject illuminated by incident radiation, includes a flexible substrate, a photosensor array disposed on the flexible substrate, and a scintillator. The scintillator is disposed so as to receive and absorb the incident radiation, is configured to convert the incident radiation to optical photons, and is optically coupled to the photosensor array. The photosensor array is configured to receive the optical photons and to generate an electrical signal corresponding to the optical photons. A digital imaging method for imaging subject includes conforming flexible digital imager to subject, the subject being positioned between flexible digital imager and a radiation source. The method further includes activating radiation source to expose the subject to radiation and collecting an image with the flexible digital imager.

18 Claims, 11 Drawing Sheets

U.S. PATENT DOCUMENTS

| | | | |
|---|---|---|---|
| 6,636,581 B1 * | 10/2003 | Sorenson | 378/58 |
| 6,717,152 B1 * | 4/2004 | Izumi | 250/370.12 |
| 6,806,473 B1 * | 10/2004 | Honda et al. | 250/370.11 |
| 6,867,418 B1 * | 3/2005 | Suzuki et al. | 250/368 |
| 2002/0168878 A1 | 11/2002 | Batey et al. | |
| 2002/0181659 A1 | 12/2002 | Watanabe et al. | |
| 2003/0031296 A1 | 2/2003 | Hoheisel | |
| 2003/0042418 A1 | 3/2003 | Yamamoto | |

OTHER PUBLICATIONS

D.B. Thomasson, M. Bonse, J. Huang, C. R. Wronski and T. N. Jackson, "Tri-layer a-Si:H Integrated Circuits on Polymeric Sustrates", IEEE Journal (1998) pp. 253-256.

C.D. Sheraw,L. Zhou,J.R. Huang,D.J. Gundlach,T.N. Jackson,M.G. Kane,I.G. Hill,M.S. Hammond, J. Campi,B. K. Greening,J. Franci, andJ. West, Organic thin-film transistor-driven polymer-dispersed liquid crystal displays on flexible Polymeric.

J. Huang, W. Qian, H Kluak, T. N. Jackson, K. Black, P Deines-Jones, S. D. Hunter, "Active-Matrix Pixelized Well Detectors on Polymeric Substrates", IEEE 51th Nat. Aerospace & Electronics Conf., Oct. (2000), pp. 476-482.

Jeffrey G. Innocenzo, "The Development of a Roll to Roll Manufacturing Process for Polymer Light Emitting Displays", Material Research Society Conference Apr. 1-5, 2002.

"Iowa Thin Film Roll-to-Roll—a-si TFT's", Downloaded Sep. 13, 2003.

Elastomeric light couplers, light-coupling masks, IBM Zurich Research Laboratory, Science & Technology, Microcontact processing, Downloaded Aug. 30, 2004.

* cited by examiner

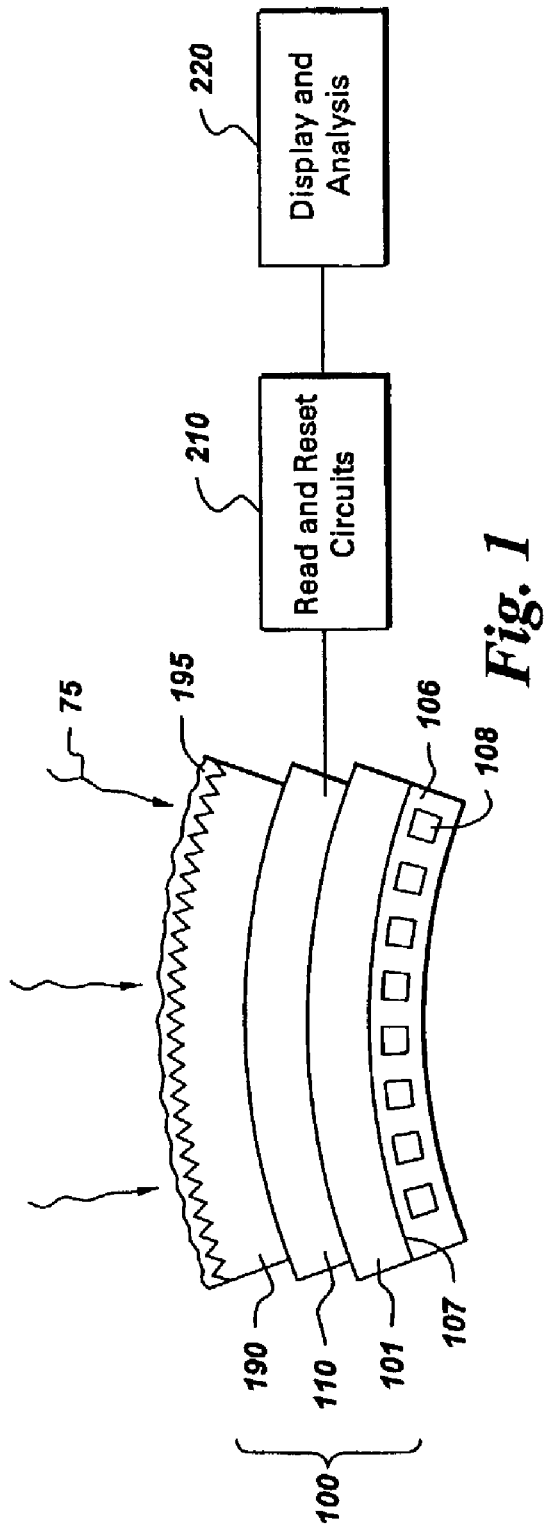
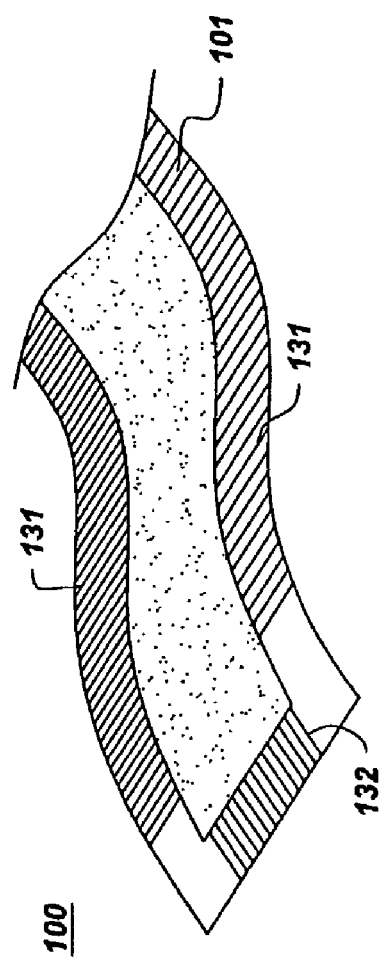
Fig. 1
Fig. 2

IMAGER

BACKGROUND OF INVENTION

The invention relates generally to radiation imagers and, more particularly, to flexible, conformable and robust radiation imagers.

Radiation imaging systems are widely used for medical and industrial purposes. Beneficially, images obtained using solid state radiation imagers are analyzed and stored electronically. However, conventional solid state radiation imagers are heavy, fragile and rigid, typically being formed on a glass substrate. This limits their industrial applications, where mobility, robustness, and low weights are requisite.

It would therefore be desirable to provide an imager that is flexible and robust to enable industrial applications, including use of the imager in confined areas that would otherwise be inaccessible for digital imaging.

SUMMARY OF INVENTION

Briefly, in accordance with one embodiment of the present invention, a flexible imager, for imaging a subject illuminated by incident radiation, is disclosed. The flexible imager includes a flexible substrate, a photosensor array disposed on the flexible substrate, and a scintillator. The scintillator is disposed so as to receive and absorb the incident radiation, is configured to convert the incident radiation to optical photons, and is optically coupled to the photosensor array. The photosensor array is configured to receive the optical photons and to generate an electrical signal corresponding to the optical photons.

A digital imaging method embodiment, for imaging a subject, is also disclosed. The digital imaging method includes conforming a flexible digital imager to the subject, the subject being positioned between the flexible digital imager and a radiation source. The digital imaging method further includes activating the radiation source to expose the subject to radiation and collecting an image with the flexible digital imager.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein:

FIG. 1 is a cross-sectional partially schematic representation of a flexible imager embodiment of the invention;

FIG. 2 shows the flexible imager of FIG. 1 in perspective view;

DETAILED DESCRIPTION

Figure 8:
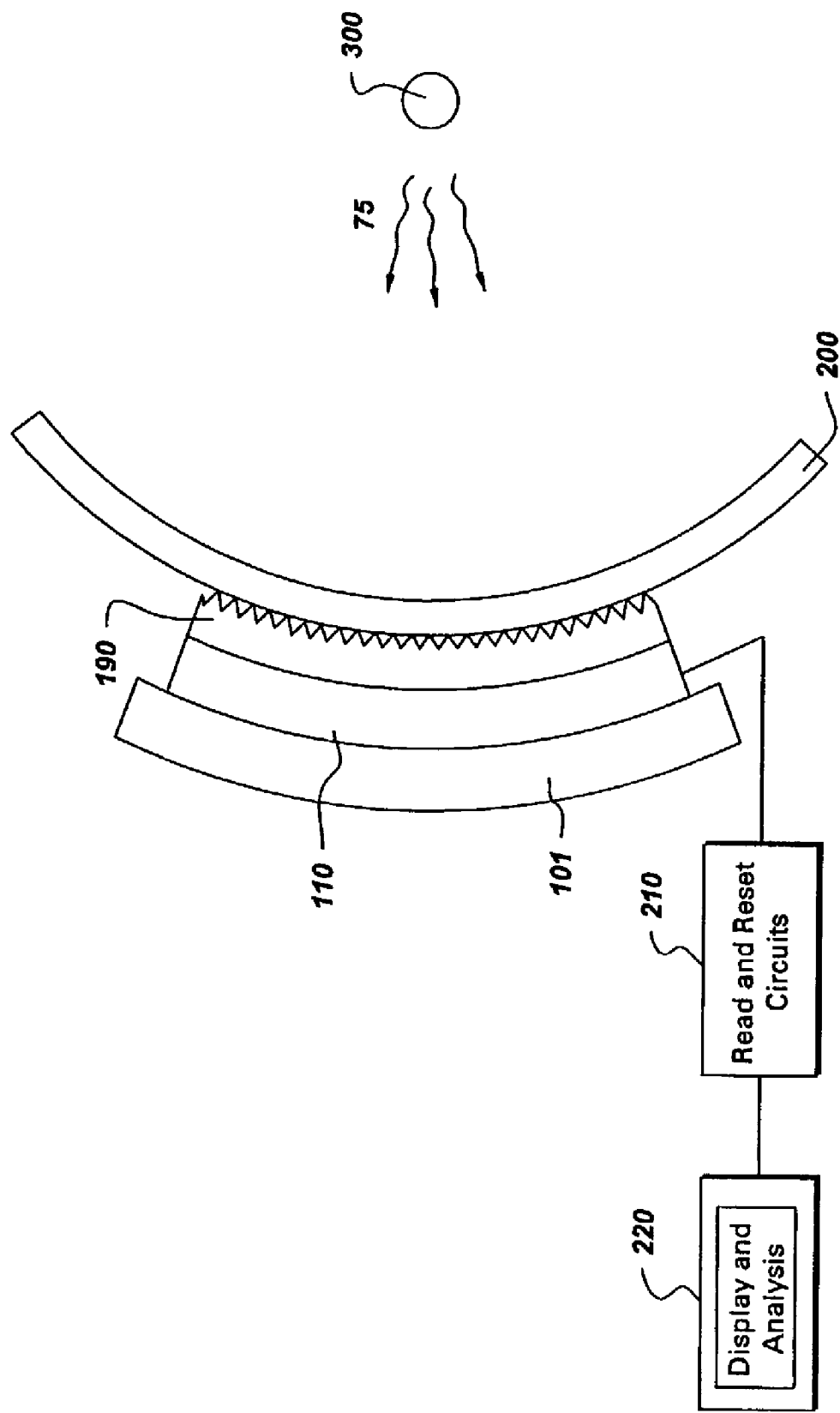
FIG. 8 illustrates a digital imaging method embodiment of the invention.

A flexible imager 100 for imaging a subject 200 illuminated by incident radiation 75 is described with reference to FIGS. 1 and 8. As indicated, flexible imager 100 includes a flexible substrate 101 and a photosensor array 110 disposed on flexible substrate 101. Flexible imager 100 further includes a scintillator 190 disposed so as to receive and absorb the incident radiation 75. Scintillator 190 is configured to convert the incident radiation 75 to optical photons and is optically coupled to photosensor array 110. Exemplary incident radiation 75 typically comprises x-rays having a wavelength within a range between about 0.0005 Angstroms and about 5 Angstroms. Photosensor array 110 is configured to receive the optical photons and to generate an electrical signal corresponding to the optical photons. It will be noted that the general structure of flexible imager 100 is similar to commonly assigned U.S. Pat. No. 5,587,591, Jack D. Kingsley et al., directed to a "Solid state fluoroscopic radiation imager with thin film transistor addressable array," which is incorporated herein by reference. However, known substrates for solid state fluoroscopic radiation imagers are rigid, for example comprising glass. In contrast, substrate 101 is flexible, as indicated in FIG. 1 by the exemplary curvature and in FIG. 2. Beneficially, flexible substrate 101 is robust, facilitating field use where imagers fabricated on substrates, such as glass, would be likely to be broken due to rough handling and transport conditions. Moreover, flexible substrate 101 allows users to conform flexible imager 100 to the surface of the object 200 being inspected, for example a portion of an aircraft structure.

To display an image corresponding to the electrical signal generated by photosensor array 110, a read and reset circuit 210 is electrically coupled to photosensor array 110 to receive the electrical signals generated in response to incident radiation 75. Read and reset circuit 210 is further coupled to display and analysis components 220 that process signals passing from the read and reset circuit to provide information to users of flexible imager 100.

According to a more particular embodiment, flexible substrate 101 is formed of a polymer. More particularly, flexible substrate 101 is formed of a flexible organic polymer, such as polyimide, examples of which include materials marketed under the trade names Kapton® and Upilex®. Upilex® is commercially available from UBE Industries, Ltd., and Kapton® is commercially available from E. I. du Pont de Nemours and Company. Other exemplary flexible organic polymers include polyethersulfone (PES) from BASF, polyethyleneterephthalate (PET or polyester) from E. I. du Pont de Nemours and Company, polyethylenenaphthalate (PEN) from E. I. du Pont de Nemours and Company, and polyetherimide (PEI) from General Electric.

In order to enhance the flexibility of flexible imager 100, while providing mechanical stability during processing, flexible substrate 101 is about two (2) mils to about ten (10) mils in thickness, according to a particular embodiment. More particularly, flexible substrate 101 is about three (3) mils to about eight (8) mils in thickness. An exemplary thickness of flexible substrate is about five (5) mils.

Figure 3:
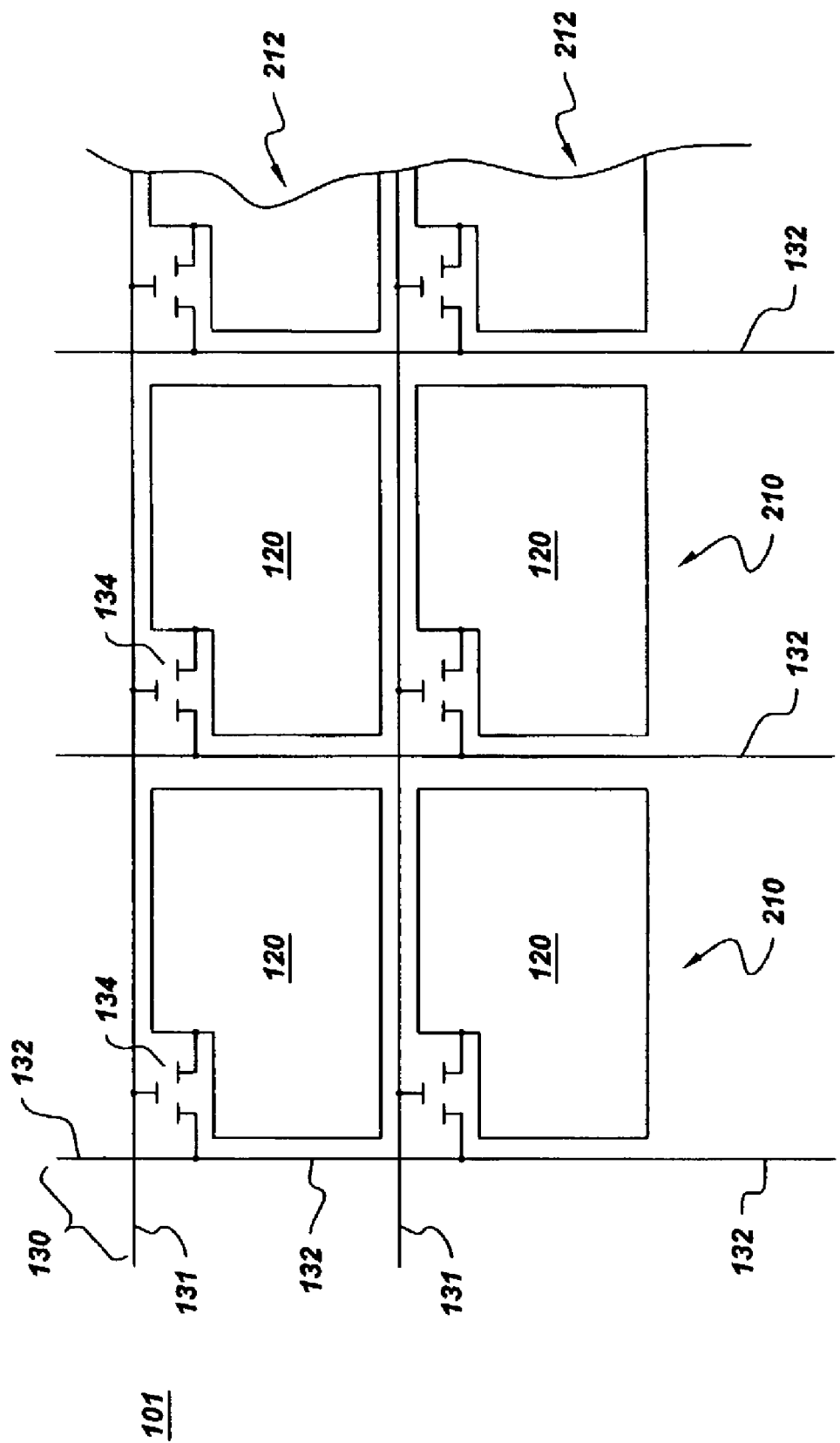
FIG. 3 shows a portion of an exemplary photosensor array for the flexible imager of FIGS. 1 and 2.

A portion of an exemplary photosensor array 110 is illustrated in FIG. 3. As shown, photosensor array 110 includes a number of photosensors 120 and an addressable thin film transistor (TFT) array 130. More particularly, each of the photosensors 120 comprises a photodiode 120, for example an amorphous silicon (a-Si) photodiode. TFT array 130 includes a number of TFTs 134, each of which is electrically coupled to a respective one of the photosensors 120, so as to selectively address the respective photosensors 120 in photosensor array 110. As shown in FIG. 3, exemplary photosensor array 110 further includes scan and data lines 131, 132, for selectively addressing each of the photosensors 120. Beneficially, polyimide a-Si sheets, commercially available from Iowa Thin Films Technology, Inc, can be processed to form photodiodes disposed on a flexible substrate.

It will be noted that the general structure of photosensor array 110 is the same as shown in FIG. 1(B) of commonly assigned U.S. Pat. No. 5,587,591, discussed above. Accordingly, a detailed description of photosensor array 110 is omitted. Briefly, exemplary TFTs 134 include a gate electrode 138, a semiconductive region 139 disposed over gate electrode 138, and a source and a drain electrode 137, 136 in contact with semiconductive region 139, as shown for example in FIG. 4. For the particular layered structure of TFT 134 shown in FIG. 5, semiconductive region 139 is disposed over a gate dielectric layer 102. In addition to the typical materials and techniques used in forming source and drain electrodes 137, 136, materials that do not require conventional photolithography can also be employed. Conventional materials for source and drain electrode 137, 136 include gold (Au), palladium (Pd), platinum (Pt), nickel (Ni), chromium (Cr), aluminum (Al), molybdenum (Mo), tungsten (W), titanium (Ti), and indium tin oxide (ITO). However, source and drain electrodes 137, 136 can also be formed from electrically conductive ("conductive") ink, for example comprising metallic nanoparticles such as titanium oxide ($TiO_2$) and gold (Au), or conductive polymers, such as polyethylenedioxythiophene (PEDOT), using known techniques such as ink jet or screen printing, at potentially lower costs. Source and drain electrodes 137, 136 formed of conductive ink or conductive polymers are acceptable for industrial imaging applications because of the slightly lower speeds and/or higher voltages involved. According to a more particular embodiment, gate electrode 138 is formed from conductive ink or conductive polymers and provides an approximately pin-hole free and smooth surface, for example having about one (1) to about ten (10) nm RMS roughness, to facilitate formation of a gate dielectric layer 102 thereon having good surface quality and electrical properties. Scan and data lines 131, 132 are formed of conductive materials, such as Au, Ni, Al, Mo, and chromium/gold (Cr/Au) or chromium/molybdenum (Cr/Mo) bilayers. Exemplary scan and data lines 131, 132 are shown in FIG. 2.

Figure 4:
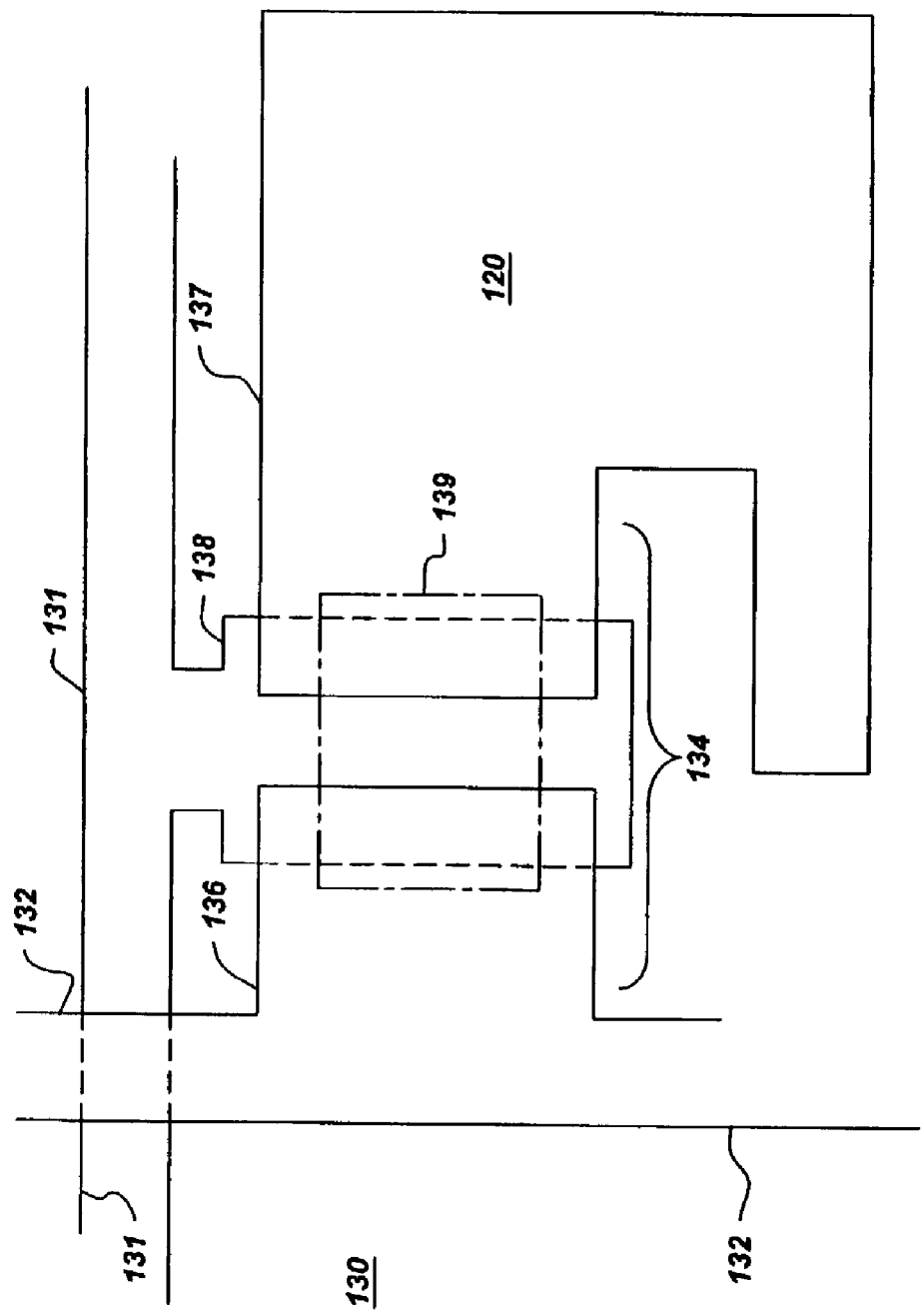
FIG. 4 shows an exemplary thin film transistor of the photosensor array of FIG. 3.
Figure 5:
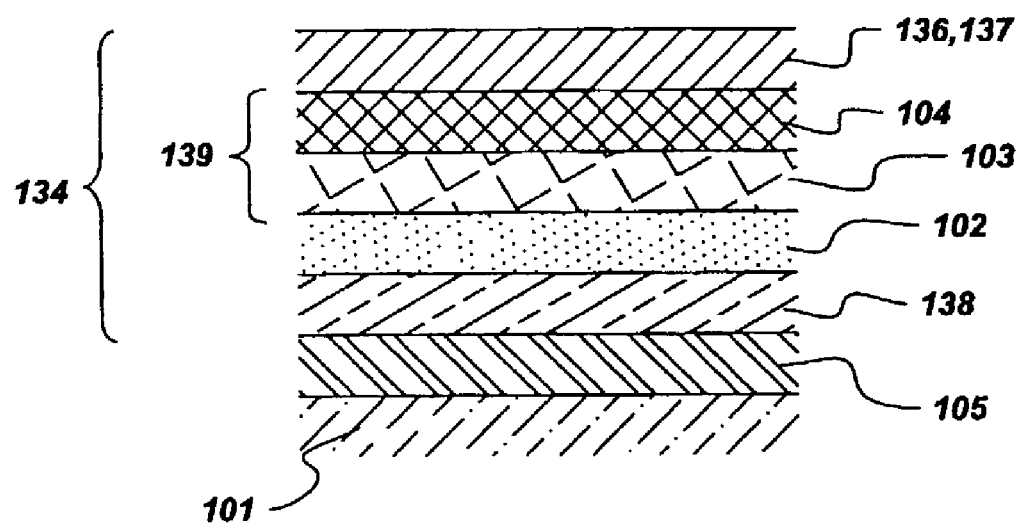
FIG. 5 illustrates a layered structure of the thin film transistor of FIG. 4.

According to a particular embodiment, TFTs 134 are conventional amorphous silicon (a-Si) based TFTs, as disclosed for example in U.S. Pat. No. 5,587,591, discussed above. Briefly, source and drain electrodes 137, 136 are disposed over semiconductive region, as indicated in FIG. 4. For this embodiment, semiconductive regions 139 include a layer of intrinsic a-Si 103 and a layer of doped a-Si 104 disposed over the layer of intrinsic a-Si, as shown, for example, in FIG. 5. Beneficially, a-Si based TFTs 134 provide desirable device characteristics, such as carrier field-effect mobility, subthreshold slope, and the on/off ratio of the source/drain current. More particularly, addressable TFT array 130 is situated between flexible substrate 101 and the photosensors 120, each photosensor 120 comprising an a-Si photodiode 120. For this embodiment, exemplary scan lines 131 are formed of Aluminum (Al) or of a Chromium/Molybdenum (Cr/Mo) bilayer, and exemplary data lines 132 comprise Molybdenum (Mo). In addition, each of the TFTs 134 includes a gate dielectric layer 102 positioned between gate electrode 138 and semiconductive region 139, as indicated in FIG. 5. Conventional gate dielectric layers 102 are formed of silicon nitride ($SiN_x$) or silicon dioxide ($SiO_2$). However, to enhance the flexibility of flexible imager 100, gate dielectric layer 102 may also be formed of organic dielectric materials, such as polyimide, polyamide, parylene, and benzocyclobutene (BCB) and other like organic dielectric materials.

To provide mechanical stability during processing such as photolithography, flexible imager 100 may also include a coating layer 105, disposed between flexible substrate 101 and addressable TFT array 130, as indicated for example in FIG. 5. Exemplary coating layers 105 include silicon nitride $SiN_x$, silicon dioxide ($SiO_2$) and aluminum oxide ($Al_2O_3$). Other benefits of coating layer 105 include providing a moisture barrier and avoid solvent outgassing and polymer chain decomposition during processing, such as photolithography.

For the particular embodiment illustrated in FIG. 1, flexible imager 100 further includes a back surface layer 106 disposed on a back surface 107 of flexible substrate 101. More particularly, back surface layer 106 comprises heating elements 108, and exemplary back surface layers 106 are formed of Mo, W, Pt, polycrystalline silicon (Poly-Si), zinc oxide (ZnO), tantalum nitride ($TaN_x$), conductive inks, or resistive Cermet materials such as $Cr/SiO_2$, $Ta/SiO_2$, $Ti/SiO_2$, and $W/SiO_2$. Heating elements 108 are fabricated, for example, by vacuum deposition, electrode plating, or electrodeless plating of the above-mentioned materials, incorporated with a lithographic process for film patterning. Another exemplary fabrication of back surface layer 106 employs direct printing of conductive inks instead of lithographic processes.

According to a particular embodiment, heating elements 108 include electrically-conductive thermal electrodes (not shown) for local redistribution of heat within flexible substrate 101 and for global heating and cooling of flexible substrate 101 during device processing. In this manner, back layer 106 enhances the dimensional stability of flexible substrate 101 during device processing. Operation of heating elements 108 includes applying electric current to the thermal electrodes to produce thermoelectric or joule heating effects. For thermoelectric effect based heating elements 108, the direction of heat movement relative to a thermal electrode depends upon the polarity of the applied electric current. The specific size and geometry of the thermal electrodes will vary with the size and geometry of photosensor array 110 and with other factors pertinent to a specific application.

The resistivity of heating elements 108 is selected, such that when electric current flows through a heating element 108, the resulting temperature gradient across heating element 108 causes flexible substrate 101 to shrink or expand locally as prescribed about the corresponding portion of the photosensor array 110 processing area, in accordance with the principles of the thermoelectric or joule heating. Beneficially, by providing heating elements 108 on the back surface 107 of flexible substrate 101, back surface layer 106 dynamically controls and offsets thermal dimensional changes to flexible substrate 101 during processing. For one exemplary embodiment, back surface layer 106 compensates for in-process shrinkage or expansion of flexible substrate 101 within a range of about one (1) to about one thousand (1000) parts per million (ppm).

For another exemplary fabrication embodiment, an external heating device (not shown) is mounted on flexible substrate 101 during device processing to dynamically control and offset thermal dimensional change of flexible substrate 101. The external heating device is readily detachable from flexible substrate 101 after fabrication of flexible imager 100. Significantly, both back surface layer 106 and the external heating device facilitate implementation of a heating-and-cooling control mechanism on flexible substrate 101 during device processing, to actively control and maintain the dimensional stability of flexible substrate 101 during processing.

Figure 6:
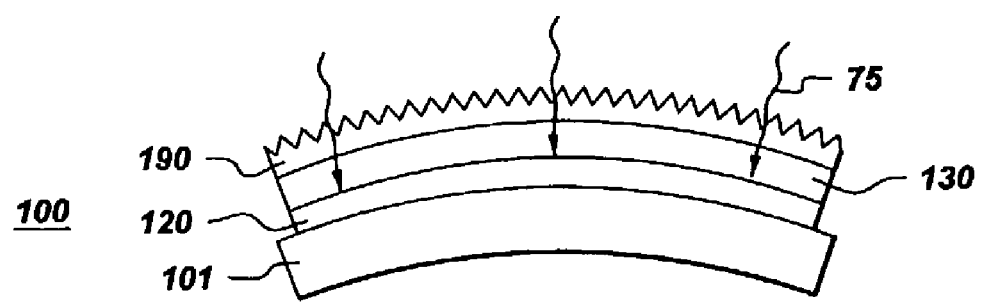
FIG. 6 displays an organic semiconductor embodiment of flexible imager 100 that includes a transparent thin film transistor array, which incorporates organic semiconductors.

Organic semiconductors are also desirable materials for semiconductive region because of their mechanical flexibility, as well as their potential for room temperature deposition processes. Accordingly, in another embodiment, semiconductive region 139 comprises an organic semiconductor (or "organic semiconductor region.") Exemplary organic semiconductors include pentacene, naphthacene, Cu-phthalocyanine, and alpha-sexithienyl. For this embodiment, exemplary scan lines 131 are formed of nickel (Ni) or aluminum (Al), and exemplary data lines 132 comprise palladium (Pd) or gold (Au). More particularly, organic semiconductive region 139 is disposed over source and drain electrodes 137, 136. The latter configuration is beneficial for protecting organic semiconductive region 139 during photolithographical processes and deposition of traditional source and drain electrodes 137, 136, comprising gold or platinum, for example. Where source and drain electrodes 137, 136 are formed using conductive ink or conductive polymers, it is beneficial to form source and drain electrode 137, 136 on top of organic semiconductive region 139 because of the generally superior performance of such top electrode configurations. As used herein, the term "over" and the phrase "on top of" are defined relative to flexible substrate 101. For example, designation that source and drain electrode 137, 136 are disposed "on top of" (or "over") organic semiconductive region 139 indicates that source and drain electrodes 137, 136 are disposed further from flexible substrate 101 than is organic semiconductive region 139, as shown for example in FIG. 5. For this organic semiconductive embodiment of flexible imager 100, photosensors 120 are desirably situated between flexible substrate 101 and addressable TFT array 130, as indicated in FIG. 6, to further protect organic semiconductive regions 139 from the processing involved in of photosensors 120. According to a particular aspect of this embodiment, TFTs 134 are optically transparent to allow optical photons generated by scintillator 190 to pass through TFTs 134 to photosensors 120. Optically transparent TFTs 134 include transparent source, drain and gate electrodes 136, 137, 138 and thin, transparent, organic semiconductors 139, such as pentacene, naphthacene, Cu-phthalocyanine, and alpha-sexithienyl. Exemplary transparent source, drain and gate electrodes 136, 137, 138 comprise transparent conductive metal oxides, such as indium tin oxide ($In_2O_3$:Sn, ITO) and aluminum zinc oxide (ZnO:Al, AZO), or electron-beam or ion-beam deposited ultra-thin metal films that exhibit high optical transmittance and electrical conductivity such as aluminum (Al), palladium (Pd), nickel (Ni), and gold (Au).

As with traditional digital imagers, scintillator 190 is selected to have a relatively large cross-section for incident radiation 75, such that a large portion of the incident radiation is absorbed and generates optical photons. One exemplary material for scintillator 190 is cesium iodide (CsI), for example thallium doped cesium iodide. Beneficially, cesium iodide has a relatively large cross-section for x-rays. Certain phosphor materials, such as CsI, are deposited as a thin film, according to a particular embodiment. According to another embodiment, CsI is formed in fiber form. Other exemplary scintillator materials are deposited directly on photosensor array 110 using binders, by employing techniques known to the industry. According to another embodiment, scintillator 190 comprises a photocathode material, such as amorphous selenium. For this embodiment, photosensor array 110 is configured to detect electrons, not light. For another embodiment, scintillator 190 comprises a phosphor screen 190. Phosphor screen 190 is optically coupled to photosensor array 110, for example via optical epoxy, UV cured adhesive, or optical coupling grease. Exemplary phosphor screens 190 comprise gadolinium oxysulfide with terbium oxide activation. Other exemplary phosphor screens 190 comprise x-ray phosphors, such as $BaFCl:Eu2+$, $YTaO_4$, and ZnCdS:Cu, formed into polycrystalline particles and ultimately into x-ray phosphor screen 190.

To protect scintillator 190, flexible imager 100 may also include a cover layer 195 disposed over scintillator 190, as indicated in FIG. 1. Exemplary cover layers 195 are formed of parylene. According to a more particular embodiment, cover layer 195 is configured to block ambient light incident on scintillator 190, and one exemplary material comprises polyethylene, which desirably is a black, flexible organic base material. An exemplary cover layer 195 comprises a polyethylene sleeve, which is often used to cover x-ray film and beneficially provides a light tight seal for scintillator 190.

Figure 7:
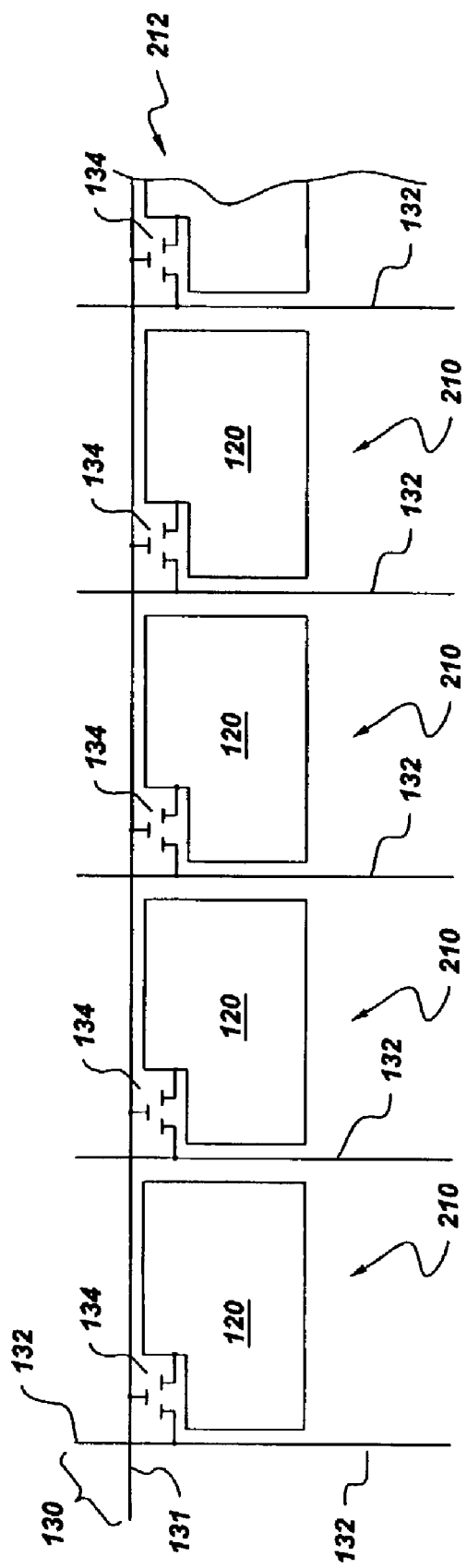
FIG. 7 shows a portion of a linear array of photosensors and thin film transistors.

A flexible digital imager 100 embodiment, for imaging a subject 200 illuminated by incident radiation 75, is discussed with reference to FIGS. 1, 3 and 7. Descriptions of features discussed above are not repeated. Briefly, as shown in FIG. 1, flexible digital imager 100 includes flexible substrate 101, photosensor array 110 disposed on flexible substrate 101, and scintillator 190. As discussed above, photosensor array 110 includes a number of photosensors 120 and addressable thin film transistor TFT array 130. As shown in FIGS. 3 and 7, photosensors 120 are arranged to form a number of columns 211 and at least one row 212. According to a particular embodiment, flexible substrate 101 is formed of a flexible organic polymer and is about three 3 mils to about eight 8 mils in thickness. According to a more particular embodiment, flexible digital imager 100 further includes back surface layer 106 disposed on back surface 107 of flexible substrate 101, as discussed above. As discussed above, exemplary TFTs 134 incorporate a-Si or organic semiconductive regions 130.

For the embodiment shown in FIG. 7, photosensors 120 are arranged to form one row 212. For this configuration, photosensor array 110 forms a linear array. Beneficially, fabrication of a linear array configuration on flexible substrate 101 is relatively easier because thermally induced dimensional changes to flexible substrate 101 during processing decrease with reduced processing area.

One particularly useful application of the linear array embodiment of flexible imager 100 is to supply the primary detection component (or linear array CT scanner, which is also indicated by reference numeral 100) of a computed tomography (CT) system (not shown), for medical or industrial imaging. In computed tomography applications, a linear array CT scanner 100 is typically angled toward the cone beam of radiation, as shown for example in FIG. 10. Currently, the manufacture of medical linear array CT scanners is quite labor intensive, in that individual modules of the photosensors (for example, silicon diodes) and scintillators are constructed and assembled such that neighboring photosensor/scintillator modules are positioned at a slight angle relative to one another for alignment with the incident x-rays. In contrast, for the exemplary linear array CT scanner 100 of FIG. 10, each photosensor 120 is oriented at a predetermined angle relative to an adjacent photosensor 120, for alignment with the incident radiation 75. According to one embodiment, flexible substrate 110 and linear photosensor array 110 are arranged in a fixed configuration, such that the position and relative orientation of each of the photosensors 120 is fixed. In another embodiment, linear photosensor array 110 and flexible substrate 101 are configured to be adjustable for arranging each photosensor 120 at a predetermined angle relative to an adjacent one of photosensors. For the latter embodiment, because flexible imager 100 is flexible, the row 212 of photosensors 120 is configured to be repositioned to adjust to changes in the distance between flexible imager 100 and radiation source 300, for example to change the geometric magnification of the object under inspection 200. Beneficially, the manufacturing process for linear array CT scanner 100 is simple relative to the current manufacture process for linear array CT scanners, discussed above. Moreover, for linear array CT scanner 100, photosensors 120 are configured as a continuous row 212, rather than an arrangement of discrete photosensor cells, providing superior alignment with the x-ray beam 75, at a lower cost.

For the embodiment depicted in FIG. 3, photosensors 120 are arranged to form a number of rows 212, forming a two dimensional (2D) photosensor array 110. Beneficially, 2D arrays facilitate imaging large portions of subject 200, depending on the number of columns 211 and rows 212 and on the size of the photosensors 120. More particularly, 2D arrays generate 2D images from a single scan and provide broader area imaging capability. 2D arrays are further capable of imaging multiple objects or objects possessing intermittent features in one scan. These capabilities are desirable for industrial nondestructive testing applications, for example imaging portions of an aircraft fuselage or engine, of a marine vessel or of components, such as printing circuit boards and optical electronics chips. Other possible future applications include space exploration, for example for performing real-time, in-flight medical diagnosis of astronauts and workers at space stations or for mapping high-energy radiation sources in space. Moreover, alignment and manufacturing benefits similar to those described above with respect to the linear array embodiment apply to the 2D array embodiment of flexible imager 100, as well.

The 2D embodiment of flexible imager 100 is particularly useful in both manufacturing and in-service inspection applications. For example, current x-ray inspection of large structural castings (not shown) requires sliding x-ray film (not shown) into tight assemblies and conforming the x-ray film to the structural casting, with an x-ray source irradiating an opposing surface of the structural casting. Beneficially, flexible imager 100 is a real-time conformable detector, which provides rapid feedback on the orientation of flexible imager 100 with a defect, such as a crack or a hot tear, both of which are highly alignment sensitive. Thus, alignment and detection of these tight linear features are more readily facilitated using flexible imager 100, relative to a slow film exposure, where more than ten (10) minutes is typically consumed prior to learning whether the exposure and alignment are successful. In-service inspection applications, for example of land-based or aircraft gas turbine engines, also benefit from this 2D embodiment of flexible imager 100. Beneficially, flexible imager 100 is a flexible, real-time device that is capable of being placed into tight locations and of conforming to the structure under inspection. In this manner, flexible imager 100 can be used to gain access to specific critical locations, which is useful for determining position location, defect alignment and to rapidly confirm proper exposure conditions in advance of performing a high definition nondestructive inspection.

A digital imaging method embodiment is described with reference to FIG. 8. The digital imaging method includes conforming a flexible digital imager 100 to the subject 200, as indicated in FIG. 8. Flexible digital imager 100 is positioned such that scintillator faces the subject 200. A radiation source 300, for example an x-ray source, is activated to expose the subject 200 to radiation 75. In this manner, radiation 75, such as x-ray radiation 75, travels through subject 200 and impinges upon scintillator 190. The method further includes collecting an image with flexible digital imager 100. For example, electrical signals generated by flexible digital imager 100 in response to incident radiation 75 are received by read and reset circuit 210, which is further coupled to display and analysis components 220, as discussed above with respect to FIG. 1 and as indicated in FIG. 8.

As indicated in FIGS. 3 and 7, flexible digital imager 100 may include a number of photosensors 120 arranged in either a linear or a two dimensional (2D) array. As noted above, linear array configurations provide fabrication benefits, whereas 2D arrays provide 2D imaging and broad imaging capability. Although linear arrays provide one-dimensional information of an object being imaged 200, 2D information can be obtained with linear array configurations that are mobile during an image scan, which increases the complexity and cost of 2D imaging, relative to performing single scans with 2D array configurations.

Figure 9:
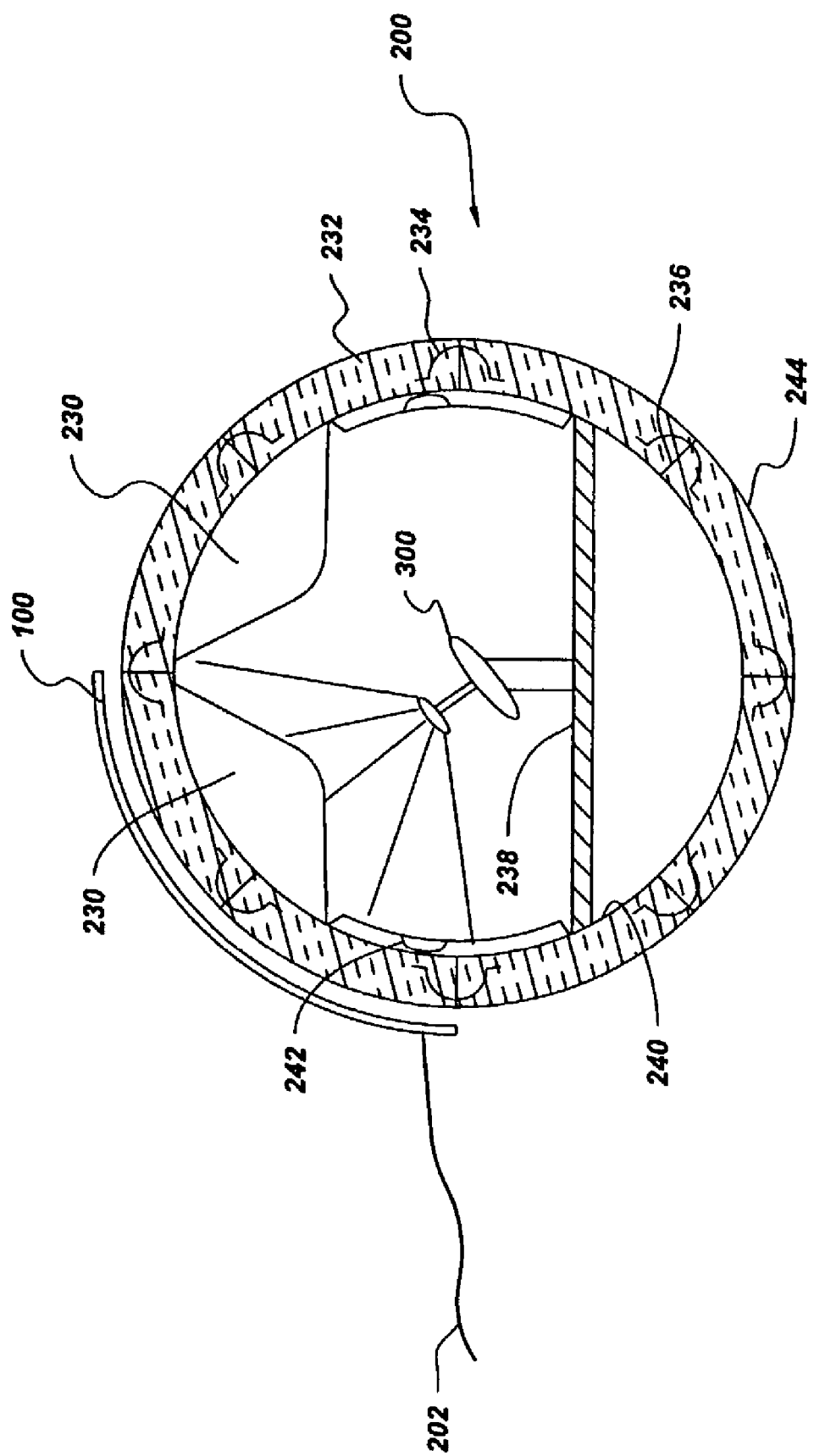
FIG. 9 shows an aircraft imaging method embodiment of the invention.

One of the applications contemplated for the inventive method is aircraft inspection. This application is illustrated in FIG. 9, where subject 200 is a portion of an aircraft, for example a commercial aircraft. For the arrangement shown in FIG. 9, the subject 200 is a fuselage 200, and the flexible imager 100 is wrapped around at least a portion of fuselage 200 and, more particularly, around an outer skin 244 of fuselage 200. As shown in FIG. 9, fuselage 200 includes a frame 236, a number of stringers 234 and at least one porthole 242, and radiation source 300 is positioned on deck 238. Currently, inspection of commercial airliners requires disassembly of the side panels and insulation 232 to inspect the structurally critical frames 236 and stringers 234 of the fuselage 200. However, the inventive method facilitates inspection of stringers 234 and frame 236 through insulation 232, overhead bins 230, and sidewalls 240, thereby permitting inspection without disassembly, which reduces inspection costs and avoids potential problems associated with reassembly of the insulation 232. Beneficially, flexible digital imager 100 can be formed in large sheets, for example using polyimide a-Si sheets, such as those commercially available from Iowa Thin Films Technology, Inc. This large-scale embodiment of flexible digital imager 100 is transportable in rolls, which can be wrapped around fuselage 200, for inspection of fuselage. One exemplary radiation source 300 is a panoramic x-ray tube 300 powered by a high voltage power supply (not shown). Panoramic x-ray tubes emit radiation with a broad angular distribution, for example in excess of about sixty degrees. However, the digital imaging method is not limited to any specific type of radiation source 300. In this manner, aircraft structures 200, such as fuselages 200 can be efficiently inspected, providing digital images and avoiding the use and disposal of volumes of x-ray film.

Other desirable applications include use in remote locations, accessible over rugged terrain, where conventional rigid digital x-ray panels would be prone to breakage. Another desirable application of the inventive method is to position or flex flexible imager 100 into hard to access locations, such as in narrow openings, where rigid x-ray panels would be prohibited. Beneficially, these applications of the inventive method permit digital imaging in locations and positions where previously only x-ray film (not shown) could be employed, yielding digital images which are readily stored and analyzed using computers (not shown) and avoiding the use, storage and disposal of x-ray film. Moreover, film radiographic imaging at field locations often requires that either a film processor (not shown) be brought to the inspection site, or that films be returned to a dark room for development. The present digital imaging method, combined with readily available laptop computers 220 eliminates the need for either of these approaches, and provides a real-time understanding of the inspection. Further, in addition to imaging aircraft, other desirable applications include imaging sections of pipelines (not shown), to detect corrosion or degrading welds, and equipment and instrumentation in nuclear facilities, such as reactor chambers, radiation resistant devices and anti-radiation structures and waste process pipelines and machinery.

Other exemplary applications of the inventive method include imaging space-flight instrumentation, satellites and space station component, during construction and/or maintenance. For these exemplary applications, flexible imager 100 is focally conformed to parts, struts, walls, and supporting structures.

Figure 10:
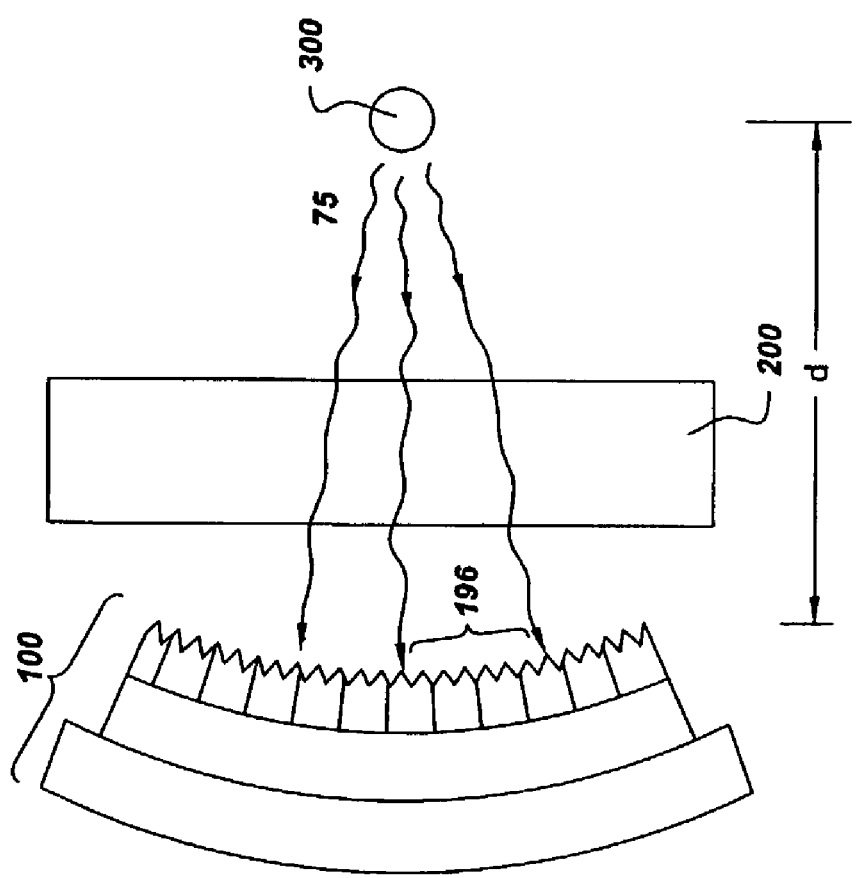
FIG. 10 illustrates a method for aligning a columnar structure of a scintillator in a flexible imager with a diverging radiation beam, for use as a linear array computer tomography (CT) scanner, for example.

Another digital imaging method embodiment is discussed with reference to FIG. 10. The digital imaging method is adapted for imaging subject 200 using a radiation source 300, which is configured to emit a diverging radiation beam 75, as indicated in FIG. 10. The digital imaging method includes bending flexible digital imager 100, for which scintillator 190 has a columnar structure 196 to align the columnar structure parallel with the diverging radiation beam, as indicated in FIG. 10. Flexible digital imager 100 is positioned such that subject 200 is between radiation source 300 and flexible digital imager 100. Subject 200 is imaged, as described above. In addition the digital imaging method may further include adjusting a distance d between radiation source 300 and flexible digital imager 100 to further align the columnar structure 196 of scintillator 190 with the diverging radiation beam 75. Beneficial applications of this embodiment include computer tomography. As explained above with respect to the linear array CT scanner embodiment of flexible imager 100, this inventive method has both ease and cost of manufacturing and superior alignment benefits, relative to current CT methods.

Another digital imaging method embodiment is discussed with reference to FIGS. 11 and 12. The digital imaging method is adapted for repeatedly imaging one or more portions of subject 200 and includes embedding at least one flexible digital imager 100 in subject 200, and activating radiation source 300 to expose subject 200 to a diverging radiation beam 75. A portion of subject 200 is positioned between radiation source 300 and flexible digital imager 100. The method further includes collecting an image with flexible digital imager 100. As used herein, the phrase "exposing subject 200 to radiation 75" should be understood to mean exposing at least a portion of subject 200 to radiation 75. To image several portions of subject 200, a number of flexible digital imagers 100 may be embedded in subject 200. For a particular embodiment, subject 200 is a section of an aircraft structure.

Figure 11:
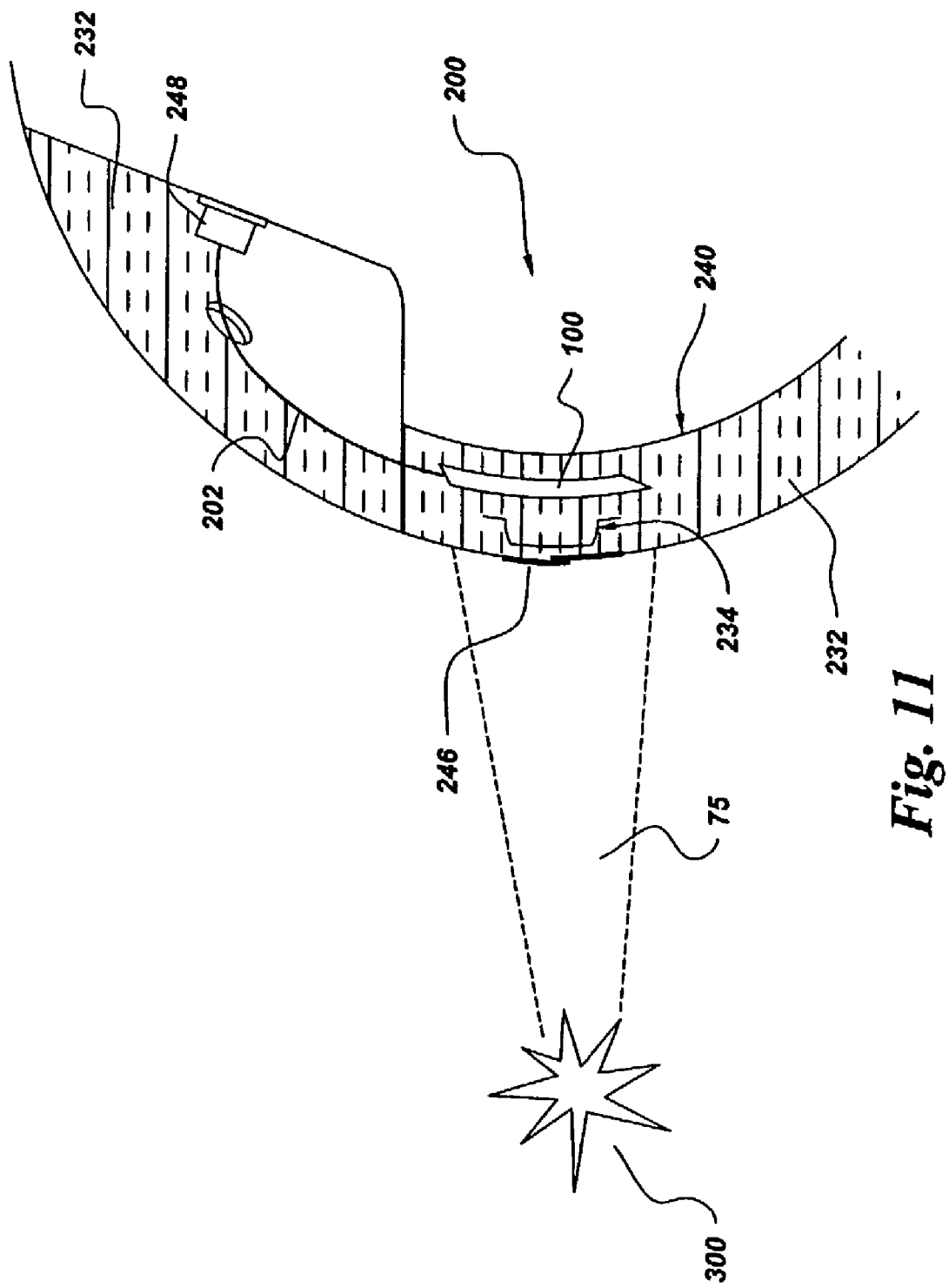
FIG. 11 illustrates a digital imaging method that includes embedding at least one flexible digital imager in a subject, for an aircraft inspection application, in which a flexible digital imager is embedded between a fuselage and an insulation layer for imaging one or more portions of the fuselage.

For the particular embodiment illustrated in FIG. 11, subject 200 is a fuselage 200, and flexible digital imager 100 is embedded between fuselage 200 and an insulation layer 232, as shown. More particularly, for the aircraft inspection application illustrated in FIG. 11, flexible digital imager 100 is positioned for imaging stringer 234 and a lap joint 246. For the exemplary configuration of FIG. 11, power and data lines 202 extend through overhead bin 232 and, more particularly, out of a junction box 248, for connection to read and reset circuit 210, display and analysis components 220 or power supplies (not shown). Alternatively, flexible digital imager 100 is remotely connected to such external components. Beneficially, by positioning flexible digital imager 100 along lap joint 246 beneath the insulation 232 in fuselage 200, detection and monitoring of cracks and corrosion can be repeatedly performed in these structurally critical locations, without removal and reinstallation of insulation 232.

Figure 12:
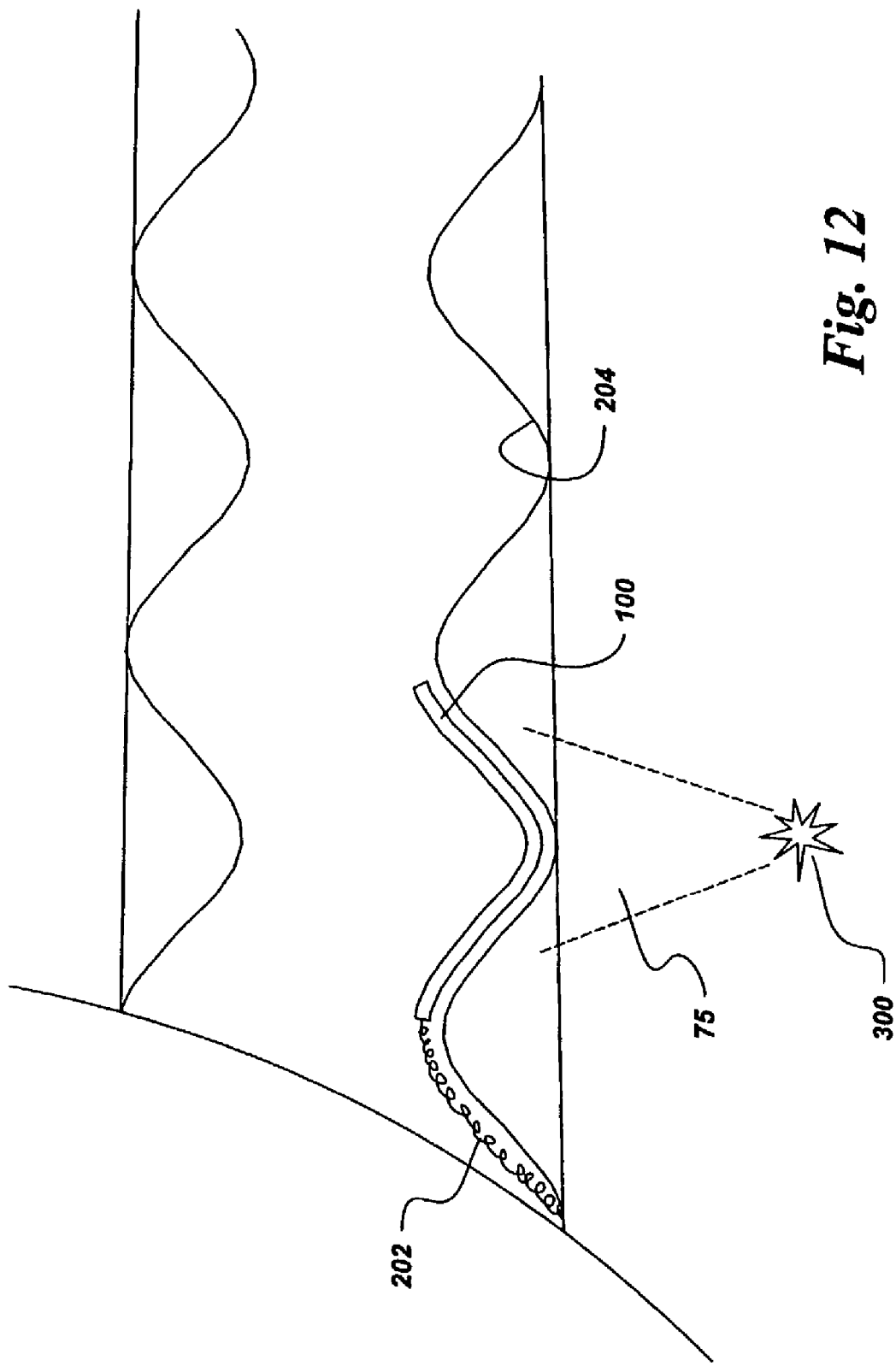
FIG. 12 illustrates another aircraft inspection embodiment of the digital imaging method, for inspecting a wing of an aircraft.

Another aircraft inspection application is illustrated in FIG. 12, for which subject 200 is a wing 200, and flexible digital imager 100 is embedded on an inner surface 204 of wing 200, for imaging a portion of wing 200. Numerous inspections for aircraft typically require individuals to enter wing 200 to place radiographic films (not shown) to ascertain the integrity of key wing structural elements. Beneficially, the aircraft inspection application shown in FIG. 12 reduces the frequency of wing entries and provides a stable tracking of these components because flexible digital imager 100 is in the same position from inspection to inspection.

Figure 13:
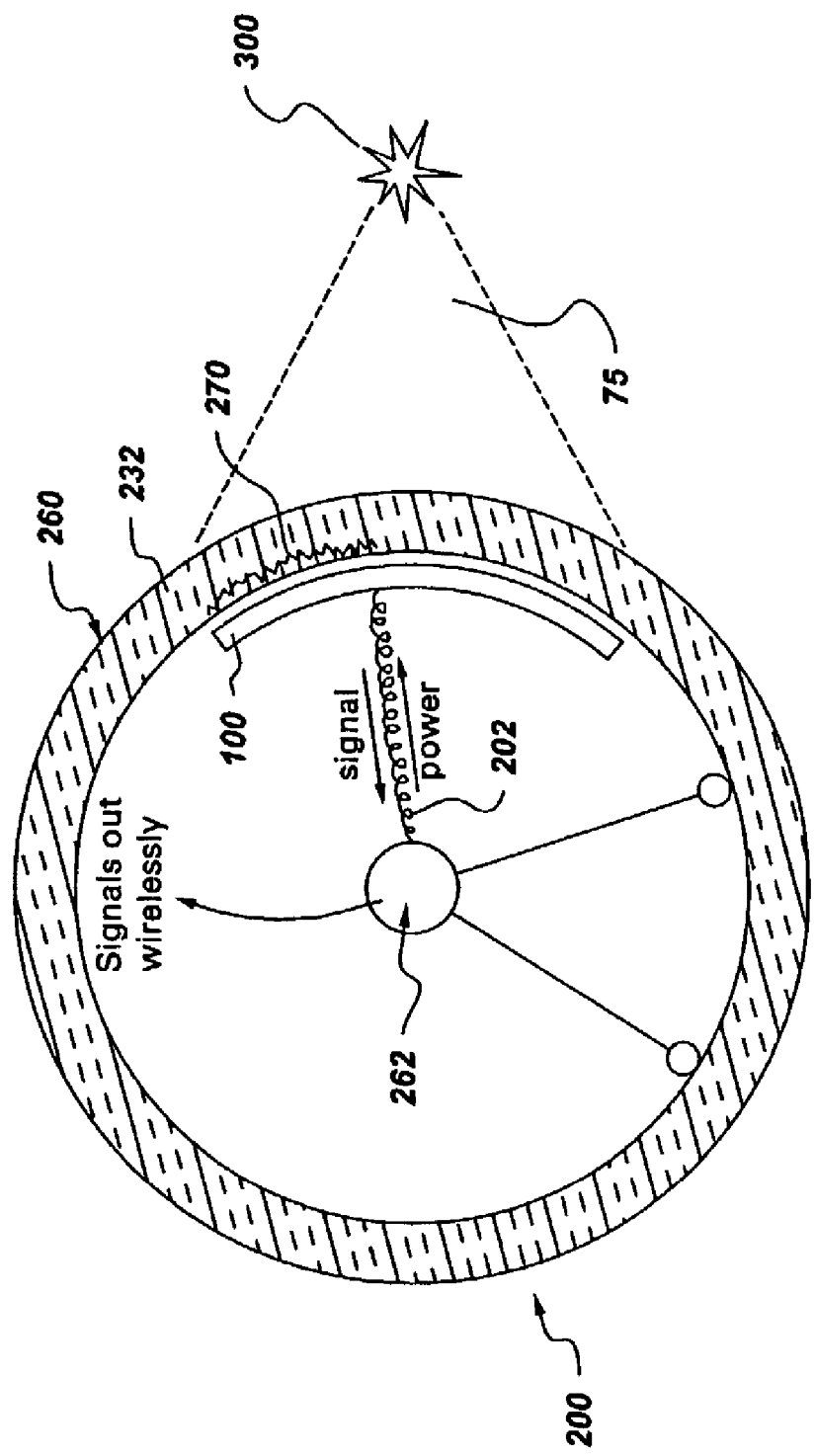
FIG. 13 illustrates a pipeline inspection application of the digital imaging method.

Other exemplary structures include sections of pipelines and equipment and instrumentation in nuclear facilities. FIG. 13 illustrates in cross-sectional view an application of the digital imaging method to a section of a pipeline, which is also indicated by reference numeral 200. As shown in FIG. 13, for this embodiment, flexible digital imager 100 is embedded in pipeline 200 under insulation 232 and flashing 260 to detect and monitor anomalies 270, such as corrosion and cracks. More particularly, flexible digital imager 100 is positioned near critical areas known to form corrosion within pipeline 200, such as along pipeline welds (not shown). To protect flexible digital imager 100 from degradation, flexible digital imager is sealed from the process fluid (not shown) by conventional sealing means. For the particular embodiment shown in FIG. 13, flexible imager is connected to a moving PIG to receive power and supply imaging data (or signal). The signal is then transmitted wirelessly from moving PIG 262.

Although only certain features of the invention have been illustrated and described herein, many modifications and changes will occur to those skilled in the art. It is thus to be understood that the appended claims are intended to cover all such modifications and changes as fall within the true spirit of the invention.

The invention claimed is:

1. An imager for imaging a subject illuminated by incident radiation, said imager comprising:
   a substrate comprising a polymer;
   a photosensor array disposed on said substrate, wherein said photosensor array comprises a plurality of photosensors and an addressable thin film transistor (TFT) array comprising a plurality of TFTs,
   wherein each of said TFTs is electrically coupled to a respective one of said photosensors so as to selectively address respective photosensors in said photosensor array, and
   wherein each of said TFTs comprises a gate electrode, a semiconductive region comprising an organic semiconductor and disposed over said gate electrode, and a source electrode and a drain electrode in contact with said semiconductive region; and
   a scintillator disposed so as to receive and absorb the incident radiation, configured to convert the incident radiation to optical photons, and optically coupled to said photosensor array,
   wherein said photosensor array is configured to receive the optical photons and to generate an electrical signal corresponding to the optical photons.

2. An imager for imaging a subject illuminated by incident radiation, said imager comprising:
   a substrate comprising a polymer;
   a back surface layer disposed on a back surface of said substrate, wherein said back surface layer comprises a plurality of heating elements;
   a photosensor array disposed on said substrate; and
   a scintillator disposed so as to receive and absorb the incident radiation, configured to convert the incident radiation to optical photons, and optically coupled to said photosensor array,
   wherein said photosensor array is configured to receive the optical photons and to generate an electrical signal corresponding to the optical photons.

3. The imager of claim 2, wherein said substrate comprises an organic polymer.

4. The imager of claim 3, wherein said substrate comprises polyimide.

5. The imager of claim 2, wherein said photosensor array comprises a plurality of photosensors and an addressable thin film transistor (TFT) array comprising a plurality of TFTs,
   wherein each of said TFTs is electrically coupled to a respective one of said photosensors so as to selectively address respective photosensors in said photosensor array,
   wherein each of said TFTs comprises a gate electrode, a semiconductive region disposed over said gate electrode, and a source electrode and a drain electrode in contact with and disposed over said semiconductive region, and
   wherein each of said semiconductive regions comprises a layer of intrinsic amorphous Silicon (a-Si) and a layer of doped amorphous Silicon disposed over said layer of intrinsic a-Si.

6. The imager of claim 5, wherein said addressable TFT array is situated between said substrate and said plurality of photosensors, wherein each of said photosensors comprises an amorphous-Silicon photodiode, and wherein said imager further comprises:
   a coating layer, disposed between said substrate and said addressable TFT array; and
   a cover layer disposed over said scintillator.

7. The imager of claim 1, wherein said semiconductive region is disposed over said source and drain electrodes, wherein said plurality of photosensors is situated between said substrate and said addressable TFT array, wherein said TFTs are optically transparent, and wherein said imager further comprises a cover layer disposed over said scintillator.

8. The imager of claim 2, wherein said scintillator comprises cesium iodide.

9. The imager of claim 2, wherein said scintillator comprises a phosphor screen.

10. A digital imager for imaging a subject illuminated by incident radiation, said digital imager comprising:
    a substrate comprising an organic polymer and being about three (3) mils to about eight (8) mils in thickness;
    a photosensor array disposed on said substrate, said photosensor array comprising a plurality of photosensors and an addressable thin film transistor (TFT) array comprising a plurality of TFTs, said photosensors being arranged to form a plurality of columns and at least one row, and each of said TFTs being electrically coupled to a respective one of said photosensors so as to selectively address respective photosensors in said photosensor array;
    a scintillator disposed so as to receive and absorb the incident radiation, configured to convert the incident radiation to optical photons, and optically coupled to said photosensor array; and
    a back surface layer disposed on a back surface of said substrate, said back surface layer comprising a plurality of heating elements,
    wherein said photosensor array is configured to receive the optical photons and to generate an electrical signal corresponding to the optical photons.

11. The digital imager of claim 10, wherein said photosensors are arranged to form one row.

12. The digital imager of claim 10, wherein said photosensors are arranged to form a plurality of rows.

13. The digital imager of claim 10, wherein each of said TFTs comprises a gate electrode, a semiconductive region disposed over said gate electrode, and a source electrode and a drain electrode in contact with and disposed over said semiconductive region, and
    wherein each of said semiconductive regions comprises a layer of intrinsic amorphous Silicon (a-Si) and a layer of doped amorphous Silicon disposed over said layer of intrinsic a-Si.

14. The digital imager of claim 13, wherein said addressable TFT array is situated between said substrate and said photosensors, each of which comprises an amorphous-Silicon photodiode, and wherein said digital imager further comprises a coating layer, which is disposed between said substrate and said addressable TFT array.

15. The digital imager of claim 10, wherein each of said TFTs comprises a gate electrode, a semiconductive region comprising an organic semiconductor and disposed over said gate electrode, and a source electrode and a drain electrode in contact with said semiconductive region.

16. The digital imager of claim 15, wherein said semiconductive region is disposed over said source and drain electrodes, wherein said plurality of photosensors is situated between said substrate and said addressable TFT array, and wherein said TFTs are optically transparent.

17. A linear array computer tomography (CT) scanner for imaging a subject illuminated by incident radiation, said linear array CT scanner comprising:
- a substrate comprising a polymer;
- a linear photosensor array disposed on said substrate, said photosensor array comprising a plurality of photosensors arranged in a row and an addressable thin film transistor (TFT) array comprising a plurality of TFTs, each of said TFTs being electrically coupled to a respective one of said photosensors so as to selectively address respective photosensors in said linear photosensor array, wherein each of said TFTs comprises a gate electrode, a semiconductive region comprising an organic semiconductor and disposed over said gate electrode, and a source electrode and a drain electrode in contact with said semiconductive region;
- a scintillator disposed so as to receive and absorb the incident radiation, configured to convert the incident radiation to optical photons, and optically coupled to said linear photosensor array, wherein said linear photosensor array is configured to receive the optical photons and to generate an electrical signal corresponding to the optical photons, and wherein each of said photosensors is oriented at a predetermined angle relative to an adjacent one of said photosensors, for alignment with the incident radiation, and wherein said substrate and said linear photosensor array are arranged in a fixed configuration.

18. The linear array CT scanner of claim 17, wherein said linear photosensor array and said substrate are configured to be adjustable for arranging each of said photosensors at a predetermined angle relative to an adjacent one of said photosensors.

* * * * *